United States Patent
Gagné et al.

(10) Patent No.: US 10,020,249 B2
(45) Date of Patent: Jul. 10, 2018

(54) ELECTRONIC DEVICE PACKAGE USING A SUBSTRATE SIDE COAXIAL INTERFACE

(71) Applicants: Jean-Frédéric Gagné, Quebec (CA); Mathieu Laliberté, Quebec (CA)

(72) Inventors: Jean-Frédéric Gagné, Quebec (CA); Mathieu Laliberté, Quebec (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 15/331,319

(22) Filed: Oct. 21, 2016

(65) Prior Publication Data
US 2018/0114741 A1    Apr. 26, 2018

(51) Int. Cl.
*H01L 29/30* (2006.01)
*H01L 21/44* (2006.01)
*H01L 23/498* (2006.01)
*H01L 23/538* (2006.01)

(52) U.S. Cl.
CPC .... *H01L 23/49827* (2013.01); *H01L 23/5384* (2013.01); *H01L 2223/6622* (2013.01)

(58) Field of Classification Search
CPC .............. H01L 23/49827; H01L 23/5384
USPC .............. 257/664, 693, 784; 438/617
See application file for complete search history.

(56) References Cited

U.S. PATENT DOCUMENTS

2017/0250120 A1* 8/2017 Harauchi .............. H01L 23/367

* cited by examiner

*Primary Examiner* — Calvin Lee
(74) *Attorney, Agent, or Firm* — Osha Liang LLP

(57) ABSTRACT

An electronic device is provided. In particular, the electronic device includes (i) an electronic integrated circuit (IC) chip, (ii) a chip mounting substrate for mounting the electronic IC chip on a chip side of the chip mounting substrate, (iii) a radio frequency (RF) interface component disposed on an opposing side of the chip mounting substrate, the opposing side opposing the chip side, and (iv) an RF bridge component penetrating a first opening in the chip mounting substrate and configured to operably connect the electronic IC chip and the RF interface component.

20 Claims, 6 Drawing Sheets

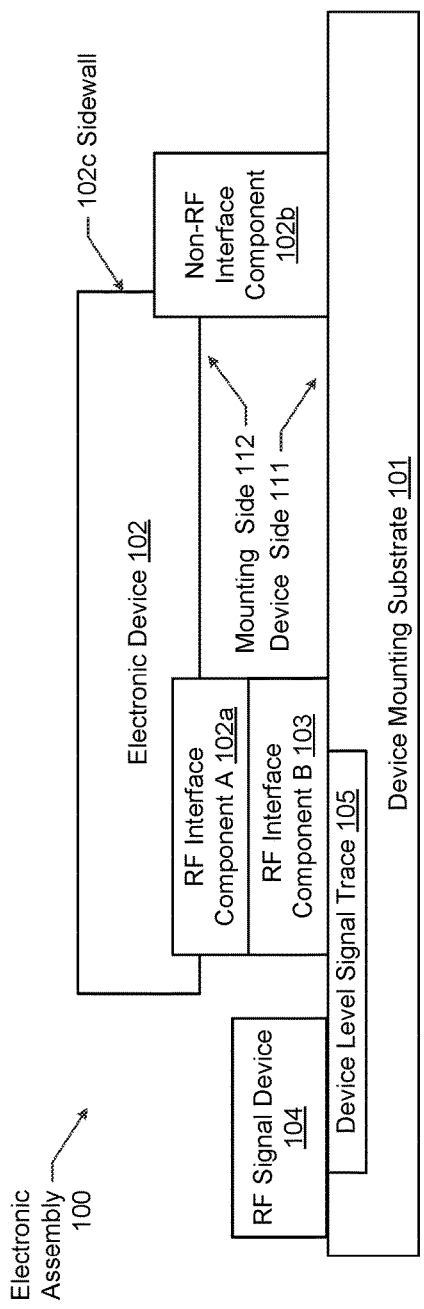
FIG. 1.1
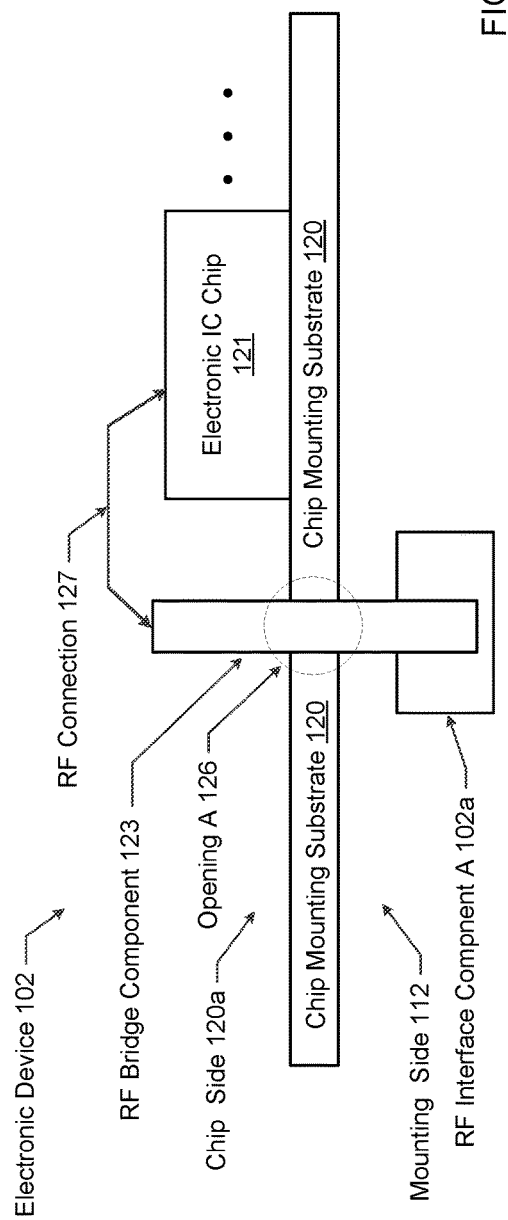
FIG. 1.2

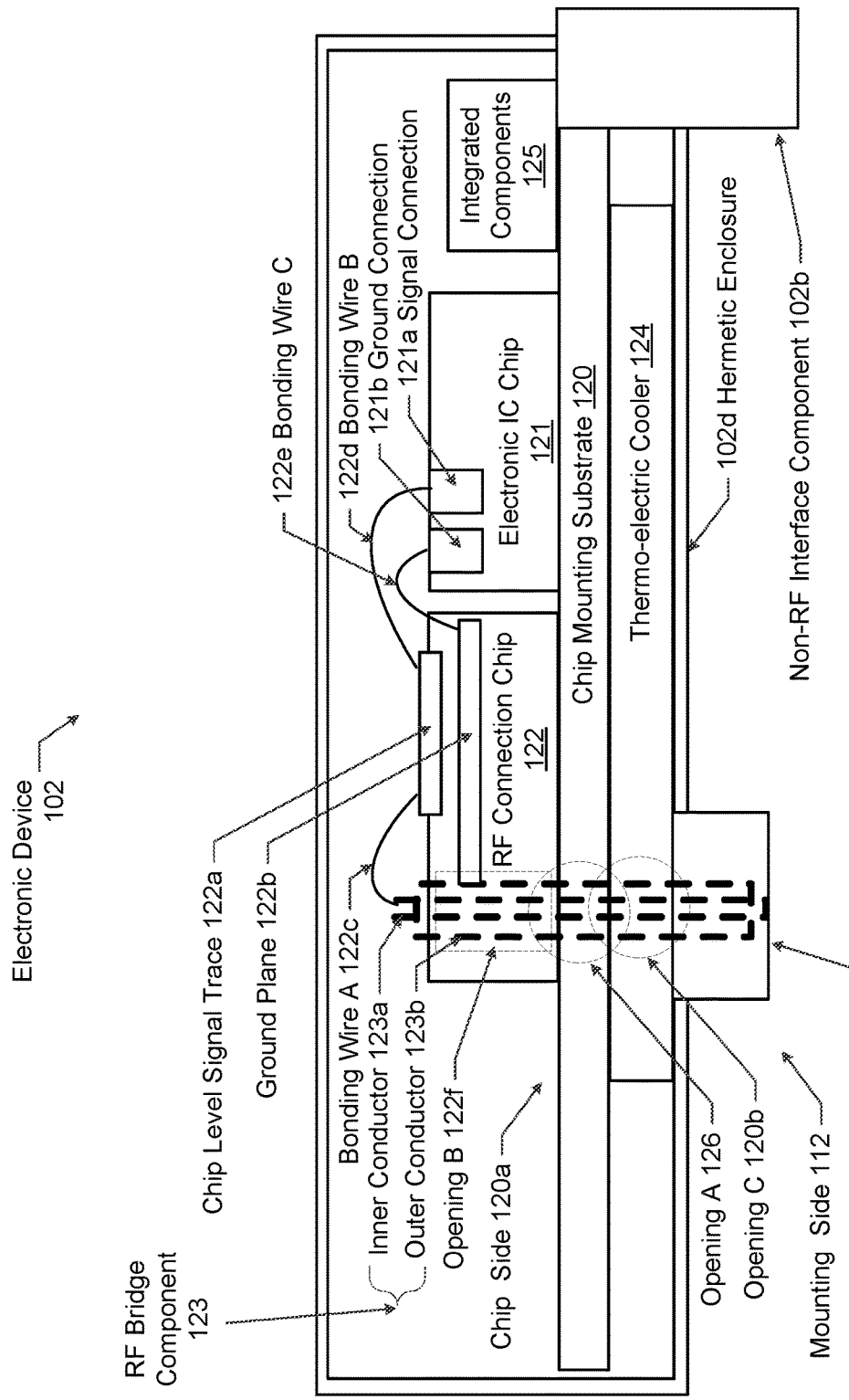
FIG. 1.3

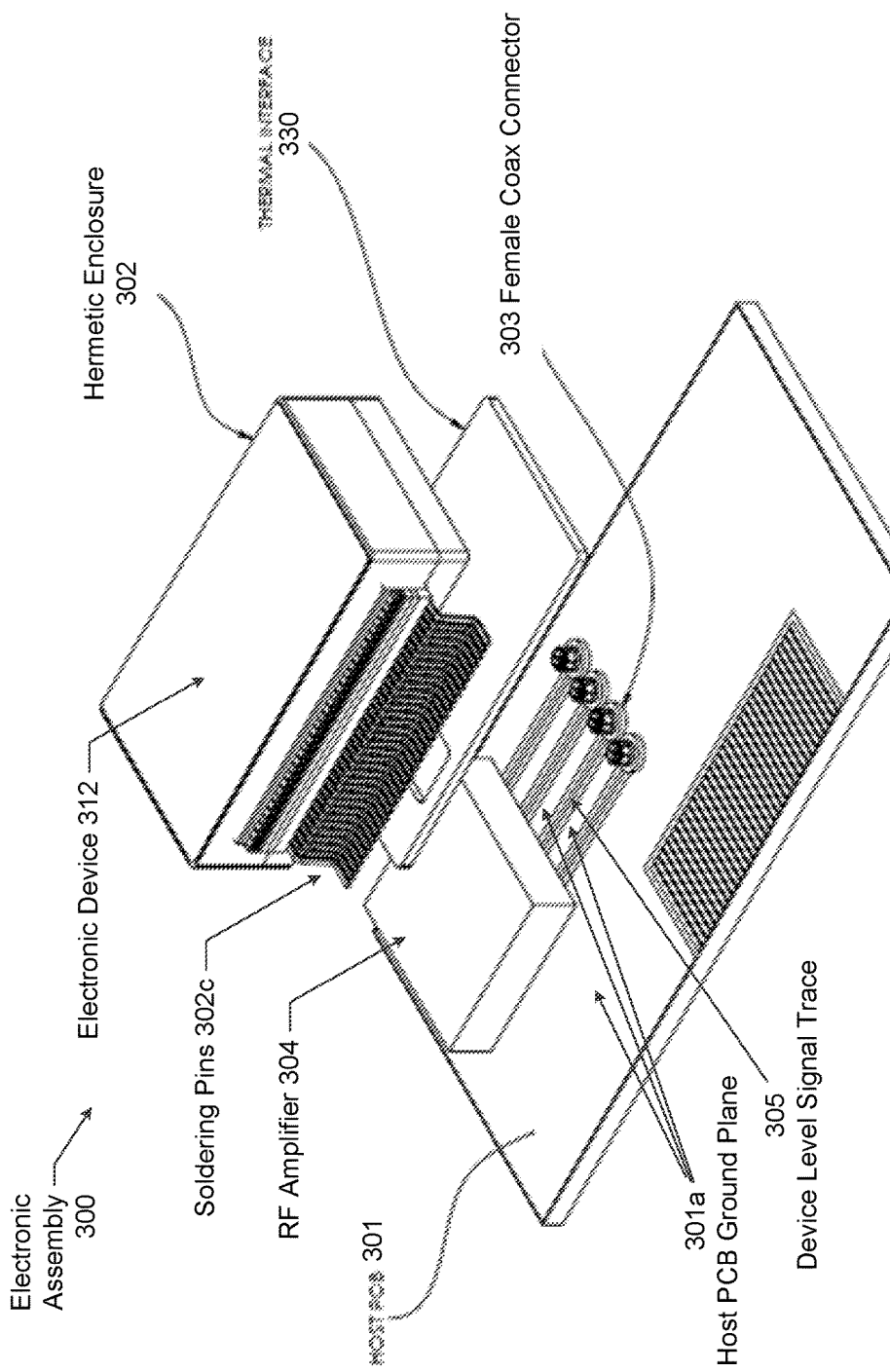
FIG. 3.1

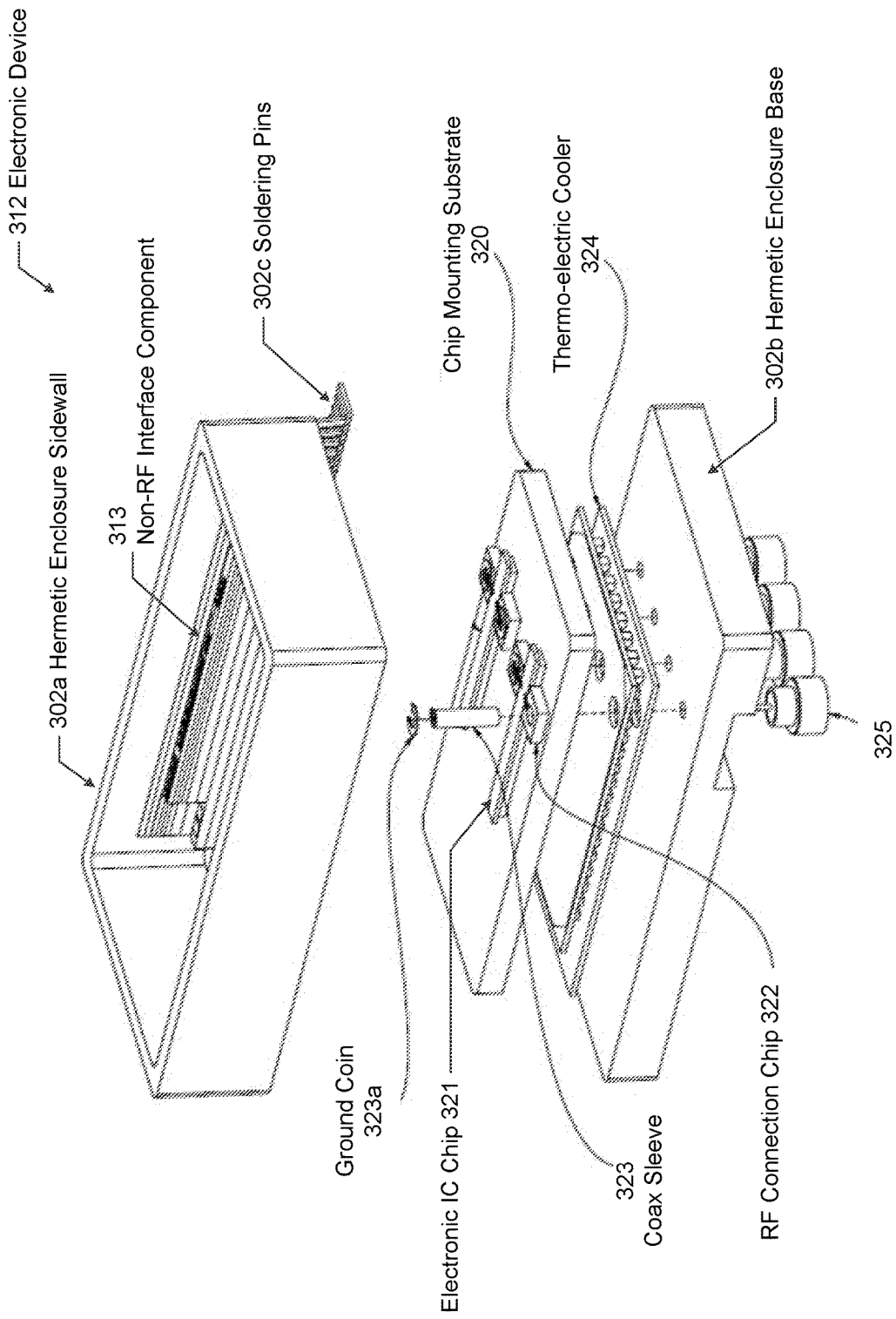
FIG. 3.2

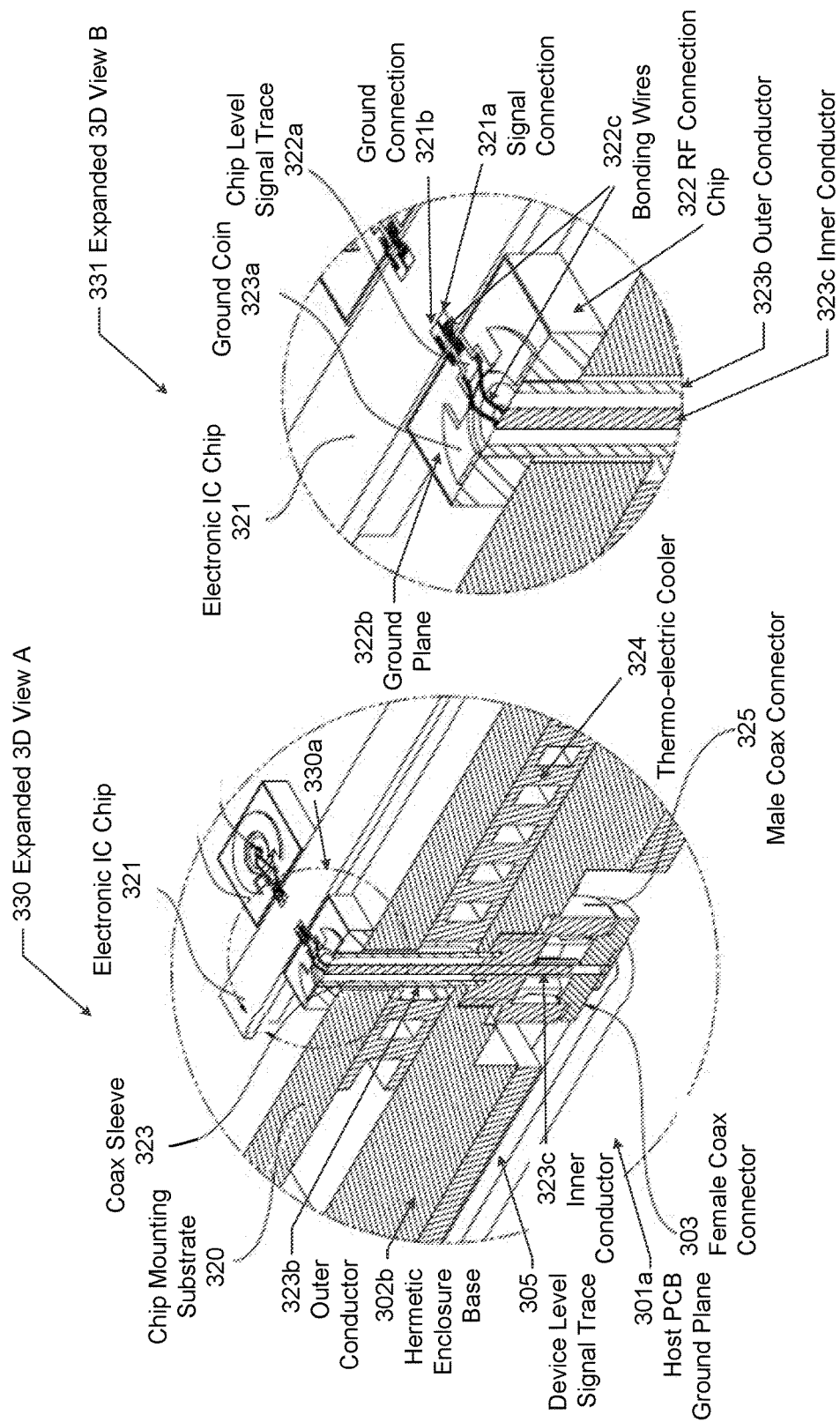
FIG. 3.3

ELECTRONIC DEVICE PACKAGE USING A SUBSTRATE SIDE COAXIAL INTERFACE

BACKGROUND

An radio frequency (RF) coax (i.e., coaxial cable) has an inner conductor surrounded by a tubular insulating layer, which in turn is surrounded by a tubular conducting shield with a tubular outer sheath or jacket. An RF connector is an electrical connector designed to work at radio frequencies with reduced change in transmission line impedance at the connection. The RF connector may connect an RF coaxial cable to an electronic circuit while maintaining the shielding provided by the RF coaxial cable. The RF connector for an electronic circuit enclosed in a hermetic package (i.e., airtight package based on metal, ceramic, or other non-porous material) may be located on a sidewall of the hermetic package.

SUMMARY

In general, in one aspect, the invention relates to an electronic device that includes (i) an electronic integrated circuit (IC) chip, (ii) a chip mounting substrate for mounting the electronic IC chip on a chip side of the chip mounting substrate, (iii) a radio frequency (RF) interface component disposed on an opposing side of the chip mounting substrate, the opposing side opposing the chip side, and (iv) an RF bridge component penetrating a first opening in the chip mounting substrate and configured to operably connect the electronic IC chip and the RF interface component.

In general, in one aspect, the invention relates to an electronic assembly that includes (i) a device mounting substrate for mounting an electronic device and a first radio frequency (RF) interface component on a device side of the device mounting substrate, where the device mounting substrate includes a device level signal trace connecting an RF signal device and the first RF interface component, (ii) the electronic device that includes a second RF interface component disposed on a mounting side of the electronic device, where the mounting side of the electronic device is aligned with the device side of the device mounting substrate, and the first RF interface component is aligned and connected with the second RF interface component, (iii) the RF signal device that is configured to exchange an RF signal with the electronic device via the device level signal trace, the first RF interface component, and the second RF interface component, and (iv) the first RF interface component.

In general, in one aspect, the invention relates to a method that includes (i) disposing a first radio frequency (RF) interface component on a device side of a device mounting substrate, wherein the device mounting substrate comprises a device level signal trace connecting an RF signal device and the first RF interface component, (ii) disposing a second RF interface component on a mounting side of an electronic device, and (iii) mounting the electronic device on the device side of the device mounting substrate. In particular, the mounting includes (iv) aligning the mounting side of the electronic device and the device side of the device mounting substrate, and (v) aligning and connecting the first RF interface component and the second RF interface component, where the RF signal device and the electronic device are configured to exchange an RF signal via the device level signal trace, the first RF interface component, and the second RF interface component.

Other aspects of the invention will be apparent from the following description and the appended claims.

BRIEF DESCRIPTION OF DRAWINGS

FIG. 1.1 shows a schematic diagram of an electronic assembly in accordance with one or more embodiments of the invention.

FIGS. 1.2 and 1.3 show an example diagram of an electronic device in accordance with one or more embodiments of the invention.

FIGS. 3.1, 3.2, and 3.3 show an example in accordance with one or more embodiments of the invention.

DETAILED DESCRIPTION

Figure 2:
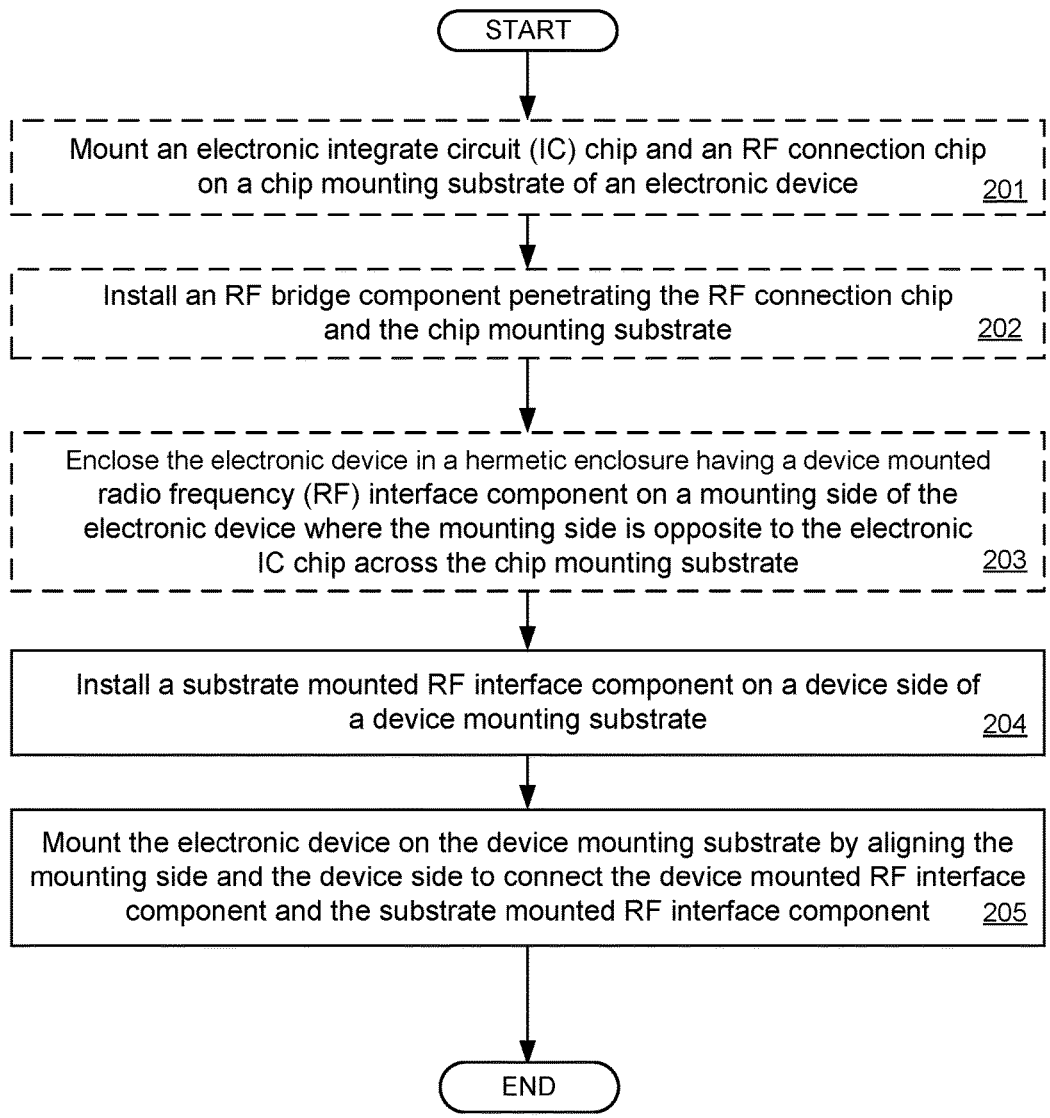
FIG. 2 shows a flowchart in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In the following description, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the invention provide a radio frequency interface for an electronic device in an electronic assembly. In particular, the electronic device includes an electronic integrated circuit (IC) chip, a chip mounting substrate for mounting the electronic IC chip on a chip side of the chip mounting substrate, an RF interface component disposed on an opposing side of the chip mounting substrate where the opposing side opposing the chip side, and an RF bridge component penetrating an opening in the chip mounting substrate, and configured to operably connect the electronic IC chip and the RF interface component. Throughout this disclosure, the terms "connect" and "connection" refer to an electrical connection unless otherwise specified. In one or more embodiments of the invention, the electronic device is an opto-electronic device and the electronic IC chip includes one or more optical components.

In one or more embodiments of the invention, the electronic assembly includes a device mounting substrate for mounting the electronic device and a separate RF interface component (referred to as the substrate RF interface component) on a device side of the device mounting substrate. The device mounting substrate includes a device level signal trace connecting an RF signal device and the substrate RF interface component. The RF interface component of the electronic device is disposed on a mounting side of the electronic device, where the mounting side of the electronic device is aligned with the device side of the device mounting substrate. Further, the RF interface component of the electronic device is aligned and connected with the substrate RF interface component. Accordingly, the RF signal device exchanges an RF signal with the electronic device via the device level signal trace, the RF interface component of the electronic device, and the substrate RF interface component.

FIG. 1.1 shows a schematic diagram of an electronic assembly (100) in accordance with one or more embodiments of the invention. In one or more embodiments of the invention, one or more of the elements shown in FIG. 1.1 may be omitted, repeated, and/or substituted. Accordingly, embodiments of the invention should not be considered limited to the specific arrangements of modules shown in FIG. 1.1.

As shown in FIG. 1.1, the electronic assembly (100) includes an electronic device (102) on a device mounting substrate (101) in accordance with one or more embodiments of the invention. In particular, the electronic device (102) is operably connected to an RF signal device (104) on the device mounting substrate (101) via a device level signal trace (105), an RF interface component A (102a), and an RF interface component B (103). In one or more embodiments of the invention, the electronic device (102) includes at least the RF interface component A (102a) and a non-RF interface component (102b). In other words, the RF interface component A (102a) and the non-RF interface component (102b) are part of the electronic device (102).

In one or more embodiments of the invention, the device mounting substrate (101) is a printed circuit board or a printed circuit film. The device mounting substrate (101) physically supports and electrically connects electronic devices. The device mounting substrate may use conductive tracks, pads and other features (e.g., device level signal trace (105)) created from conductive material on a non-conductive surface. For example, the device mounting substrate (101) may include connection traces embedded in a rigid piece of material, such as a fiber glass board, a ceramic substrate, etc. In another example, the device mounting substrate (101) may include connection traces (e.g., device level signal trace (105)) embedded in a flexible piece of material, such as a polyimide film, or other polymer based flexible film.

Further as shown in FIG. 1.1, the electronic device (102), the RF interface component A (102a), and the RF signal device (104) may be installed on the device mounting substrate (101). The installation, or mounting, is to attach a component to another component to allow for the exchange of signals. As shown in FIG. 1.1, the device mounting substrate (101) includes a device side (111) that is the side installed with the electronic device (102) and the RF interface component B (103). Correspondingly, the electronic device (102) includes a mounting side (112) that is the side installed onto the device mounting substrate (101). For example, the electronic device (102) may be affixed to the device mounting substrate (101) by mechanically connecting, on the device side (111), the RF interface component A (102a) and the RF interface component B (103). The mechanical connection establishes an electrical connection that allows the electronic device (102) and the RF signal device (104) to exchange an RF signal via the device level signal trace (105), the RF interface component A (102a), and the RF interface component B (103). In other words, when operating, a connection that transports signals may exist. In one or more embodiments, the RF interface component A (102a) and the RF interface component B (103) correspond to a male RF coax connector and a female RF coax connector, respectfully, that are connected based on a push-on action).

Continuing with FIG. 1.1, the electronic device (102) includes the non-RF interface component (102b). In contrast to the RF connector, a non-RF interface component has reduced connection quality at radio frequencies due to uncontrolled transmission line impedance change at the connection. For example, the non-RF interface component (102b may not have the shielding provided by the RF coaxial cable and may include one or more of a brazed kovar pin, a flexible cable, a glass feedthrough, a lead frame, or other suitable connecting component. The non-RF interface component (102b) may also include a mechanical support component, such as a clip, a retainer, a socket, etc. A portion of the non-RF interface component (102b) may be disposed on the sidewall (102c) and/or the mounting side (112) of the electronic device (102). In addition to mechanically connecting the RF interface component A (102a) and the RF interface component B (103), the electronic device (102) may be further affixed to the device mounting substrate (101) using the non-RF interface component (102b). For example, the non-RF interface component (102b) may be soldered or otherwise surface mounted (i.e., using surface-mount-technology (SMT)) onto the device mounting substrate (101).

In one or more embodiments of the invention, the electronic device (102) is an electronic component that includes an electronic circuit (e.g., resistors, transistors, capacitors, inductors, diodes, etc., connected by conducting wires or other traces) to perform the functions of the electronic device (102). For example, the electronic device (102) may be or may include an integrated circuit, memory modules, or other hardware component. By way of more specific examples, the electronic device (102) may be an input/output port, processing unit, memory, and/or other devices. In one or more embodiments of the invention, the electronic device (102) is an opto-electronic device that includes, in addition to or in place of the aforementioned electronic circuit, one or more optical components (e.g., optical-to-electrical or electrical-to-optical transducers, modulators, photo-transistors, photo-diodes, light emitting diodes, integrated optical circuits, microwave amplifier, microwave oscillator, microwave frequency mixer, etc.) to perform the functions of the electronic device (102). In such embodiments, in addition to or in place of the conductive traces embedded in the device mounting substrate (101), free space optic may be mounted on the chip mounting substrate (120) within the electronic device (102). By way of more specific examples, the electronic device (102) may be an optical modulator or optical receiver that converts an RF signal into a modulated optical signal in a light beam. Examples of the electronic device (102) are shown in FIGS. 1.2 and 1.3 below.

In one or more embodiments of the invention, the RF signal device (104) is an electronic component that includes an electronic circuit (e.g., resistors, transistors, capacitors, inductors, diodes, etc. connected by conducting wires or other traces) to perform the functions of the electronic device (102). In the example where the electronic device (102) is an optical modulator, the RF signal device (104) may be an RF amplifier that provides an RF signal as an input of the optical modulator.

Including the RF interface component A (102a) on the mounting side (112) of the electronic device (102) reduces the footprint of the electronic device (102) on the device mounting substrate (101). In other words, stacking the RF interface component A (102a) and the RF interface component B (103) between the electronic device (102) and the device mounting substrate (101) reduces the surface area occupied by the electronic device (102) on the device mounting substrate (101). Thus, reducing the distance between the opto-electronic device and accompanying RF signal device, placing larger electronic device or more electronic devices on the device mounting substrate, using smaller device mounting substrates, reducing disruption to line-of-sight light beams, or any combination thereof may be realized in accordance with one or more embodiments of the invention.

Although FIG. 1.1 shows a particular configuration of components, other configurations may be used without departing from the scope of the invention. For example, some components shown may not exist in some embodiments. Other components not shown may exist. For example, although not shown in FIG. 1.1, additional devices may be mounted on the device mounting substrate (101) and may exchange signals with the electronic device (102) and/or the RF signal device (104). In another example, the RF signal device (104) may be installed on a side different than the device side (111) that opposes the device side (111) where the electronic device (102) is installed.

FIG. 1.2 shows a schematic diagram of the electronic device (102) in accordance with one or more embodiments of the invention. In one or more embodiments of the invention, one or more of the elements shown in FIG. 1.2 may be omitted, repeated, and/or substituted. Accordingly, embodiments of the invention should not be considered limited to the specific arrangements of modules shown in FIG. 1.2.

As shown in FIG. 1.2, the electronic device (102) includes an electronic IC chip (121), a chip mounting substrate (120), the RF interface component A (102a), an RF bridge component (123) and an RF connection (127). Each of these components is described in detail below.

In one or more embodiments of the invention, the electronic IC chip (121) is a set of electronic elements (e.g., resistor elements, transistor elements, capacitor elements, inductor elements, diode elements, etc., connected by miniature conducting traces or bonding wires) fabricated on one small plate ("chip") of semiconductor material, such as silicon (Si), Indium phosphide (InP), etc. In particular, the electronic IC chip (121) may be a part of the aforementioned electronic circuit of the electronic device (102). By way of more specific examples, the electronic IC chip (121) may be an input/output port IC chip, processing unit IC chip, memory IC chip, and/or other IC chip. In one or more embodiments of the invention, the electronic IC chip (121) is an opto-electronic IC chip that includes, in addition to or in place of the aforementioned set of electronic elements, one or more optical components such as an optical waveguide, optical splitter, optical combiner, optical tap, optical interferometer, etc.

In one or more embodiments of the invention, the RF bridge component (123) is a conducting element having a signal conductor for routing an RF signal between the electronic IC chip (121) and the RF interface component A (102a). In one or more embodiments, the RF bridge component (123) further includes a ground conductor for routing a signal ground between the electronic IC chip (121) and the RF interface component A (102a). In particular, the construction of the RF signal conductor and the ground conductor is configured to match an RF impedance of the RF interface component A (102a) to maintain the signal quality of the RF signal propagating between the RF interface component A (102a) and the electronic IC chip (121). In one or more embodiments, the RF connection (127) includes a support structure having bonding wires and/or conducting traces that connect the RF signal conductor and the ground conductor of the RF bridge component (123) to the electronic IC chip (121). An example of the RF bridge component (123) is described in reference to FIG. 1.3 below.

In one or more embodiments of the invention, the chip mounting substrate (120) is a thin slice of material (e.g., ceramic, sapphire, aluminum oxide, etc.) that physically supports electronic IC chips, such as the electronic IC chip (121). In one or more embodiments, the chip mounting substrate (120) may be a printed circuit board or a printed circuit film. As shown in FIG. 1.1, the electronic IC chip (121) may be installed on the chip mounting substrate (120). The installation, or mounting, is to attach a component to another component to allow for the exchange of signals. The chip mounting substrate (120) includes a chip side (120a) that is the side where the electronic IC chip (121) is installed onto the chip mounting substrate (120). In addition, the chip mounting substrate (120) includes an opposing side, which is opposite of the chip side (120a), where the RF interface component A (102a) is installed onto the chip mounting substrate (120). The opposing side of the chip mounting substrate (120) is parallel to the chip side (120a) and overlaps with the mounting side (112) of the electronic device (102).

In one or more embodiments of the invention, the chip mounting substrate (120) partially or completely surrounds the RF bridge component (123). In other words, the chip mounting substrate (120) may have an opening A (126), which is a hole or cut out penetrated by the RF bridge component (123). For example, the chip mounting substrate (120) may be a thin sheet with a hole, or another shape, whereby the RF bridge component (123) is connected to the electronic IC chip (121) on the chip side (120a) and connected to the RF interface component A (102a) on the opposite of the chip side (120a). In another example, the chip mounting substrate (120) may be a thin sheet shaped with an edge cut out penetrated by the RF bridge component (123). In one or more embodiments, the opening A (126) is in proximity of the electronic IC chip (121) to reduce the physical span (e.g., length) of the RF connection (127) to maintain the signal quality of the RF signal propagating between the RF interface component A (102a) and the electronic IC chip (121). For example, the aforementioned hole or edge cut out is disposed within a pre-determined distance (e.g., 1.0 mm, 1.2 mm, etc.) from the electronic IC chip (121).

Although FIG. 1.2 shows a particular configuration of components, other configurations may be used without departing from the scope of the invention. For example, some components shown may not exist in some embodiments. Other components not shown may exist. For example, although one electronic IC chip (i.e., electronic IC chip (121)) is shown in FIG. 1.2, the electronic device (102) may include multiple electronic IC chips mounted on the chip mounting substrate (120). For example, multiple electronic IC chip may exchange electrical and/or optical signals via conducting traces embedded in the chip mounting substrate (120) and/or line-of-sight light beams. Further, while the electronic IC chip (121) is mounted on the chip side (120a) of the chip mounting substrate (120), other electronic IC chip may also be mounted on the mounting side (112) of the chip mounting substrate (120).

FIG. 1.3 shows a schematic diagram of the electronic device (102) in accordance with one or more embodiments of the invention. In one or more embodiments of the invention, one or more of the elements shown in FIG. 1.3 may be omitted, repeated, and/or substituted. Accordingly, embodiments of the invention should not be considered limited to the specific arrangements of modules shown in FIG. 1.3. In particular, FIG. 1.3 shows additional details of the electronic device (102) depicted in FIG. 1.2 above.

As shown in FIG. 1.3, in addition to the elements shown in FIG. 1.2 above, the electronic device (102) further includes a hermetic enclosure (102d), a thermo-electric cooler (124), an RF connection chip (122), integrated components (125), and a non-RF interface component (102b). Each of these components is described in detail below.

In one or more embodiments of the invention, the hermetic enclosure (102d) is a three-dimensional (3D) package configured to enclose elements of the electronic device (102), such as the electronic IC chip (121), the chip mounting substrate (120), etc. In one or more embodiments, the hermetic enclosure (102d) is made of air-tight material, such as metal, glass, ceramic, etc., to mitigate physical damage, such as corrosion of the electronic IC chip (121), the chip mounting substrate (120), etc. In one or more embodiments, the hermetic enclosure (102d) includes the RF interface component A (102a). For example, the RF interface component A (102a) may be affixed to and serve as a part of the hermetic enclosure (102d). In one or more embodiments, the hermetic enclosure is a compact and airtight enclosure within a defined margin of error. The defined margin of error may be defined to accommodate manufacturing tolerances.

In one or more embodiments of the invention, the thermo-electric cooler (124) permits accurate temperature control of the electronic IC chip (121). For example, the thermo-electric cooler (124) may be a cooling device to transfer heat from the electronic IC chip (121) to the hermetic enclosure (102d) before the heat is further transferred to the ambient environment external to the hermetic enclosure (102d) and/or the device mounting substrate (101) depicted in FIG. 1.1 above. As shown in FIG. 1.3, the thermo-electric cooler (124) is attached to the chip mounting substrate (120) on the opposite side of the chip side (120a). In particular, the thermo-electric cooler (124) is disposed between the chip mounting substrate (120) and the hermetic enclosure (102d). In one or more embodiments, the thermo-electric cooler (124) includes two layers (not shown) of different materials that uses the Peltier effect to create a heat flux across the junction of the two different material layers. In particular, the junction is parallel to two opposing surfaces of the thermo-electric cooler (124) where one surface is in contact with the chip mounting substrate (120) and the other surface is in contact with the hermetic enclosure (102d). Accordingly, the heat flux transfers the heat to or from the electronic IC chip (121) to the hermetic enclosure (102d).

In one or more embodiments of the invention, the RF connection chip (122) is a connection device configured to connect the RF bridge component (123) and the electronic IC chip (121). In addition, the RF connection chip (122) may provide physical support to the RF bridge component (123). In one or more embodiments, the RF connection chip (122) includes a slice of non-conducting material supporting a chip level signal trace (122a) and a ground plane (122b) that are on the surface of or are embedded inside the non-conducting material. In one or more embodiments, the chip level signal trace (122a) is connected to a signal terminal (e.g., inner conductor (123a)) of the RF bridge component (123) via a bonding wire A (122c) and a signal connection (121a) of the electronic IC chip (121) via a bonding wire B (122d). In one or more embodiments, the ground plane (122b) is in contact with an electrical ground (e.g., outer conductor (123b)) of the RF bridge component (123) and connected to a ground connection (121b) of the electronic IC chip (121) via a bonding wire C (122e). Accordingly, the bonding wire A (122c), the RF connection chip (122), the bonding wire B (122d), and the bonding wire C (122e) collectively form the RF connection (127) shown in FIG. 1.2 above.

In one or more embodiments of the invention, the RF connection chip (122) is mounted to the chip mounting substrate (120) on the chip side (120a) and adjacent to the electronic IC chip (121). In one or more embodiments, the RF connection chip (122) has a thickness configured to reduce a distance between the signal terminal (e.g., inner conductor (123a)) of the RF bridge component (123) and the signal connection (121a) of the electronic IC chip (121). In other words, the thickness of the RF connection chip (122) is determined to control the lengths of the bonding wire A (122c), the bonding wire B (122d), and the bonding wire C (122e). In particular, the bonding wire lengths are controlled to maintain a signal quality, e.g., of an RF signal travelling between the RF interface component A (102a) and the electronic IC chip (121).

In one or more embodiments of the invention, the RF bridge component (123) includes the inner conductor (123a) and the outer conductor (123b). In one or more embodiments, the outer conductor (123b) encloses the inner conductor (123a) via an insulated layer (not shown) to form a coax sleeve. In one or more embodiments, the RF interface component A (102a) is a coax connector coupled to the coax sleeve. As described in reference to FIG. 1.2, the RF bridge component (123) penetrates the opening A (126) of the chip mounting substrate (120). In one or more embodiments, the RF bridge component (123) further penetrates an opening B (122f) (e.g., a hole or an edge cut out) in the RF connection chip (122) and an opening C (120b) (e.g., a hole or an edge cut out) in the thermo-electric cooler (124). In one or more embodiments, the opening A (126), opening B (122f), and opening C (120b) are aligned with each other and collectively secure the RF bridge component (123) in place.

In one or more embodiments of the invention, the electronic device (102) further includes the non-RF interface component (102b) depicted in FIG. 1.1 above and the integrated components (125). In one or more embodiments, the integrated components (125) may include an electronic chip or an opto-electronic chip separate from the electronic IC chip (121). In one or more embodiments, the integrated components (125) and the electronic IC chip (121) collectively perform the function of the electronic device (102).

Although FIG. 1.3 shows a particular configuration of components, other configurations may be used without departing from the scope of the invention. For example, some components shown may not exist in some embodiments. Other components not shown may exist. For example, although elements of the electronic device (102) are enclosed or encased in the hermetic enclosure (102d), other electronic device packaging may be used in place of the hermetic enclosure (102d) to mitigate physical damage, such as corrosion of the device base. For example, the hermetic enclosure (102d) may be substituted by a plastic, resin, epoxy, or other polymer casing that may be prefabricated prior to or molded/impregnated-in-place during mounting the electronic device (102) onto the device mounting substrate (101) shown in FIG. 1.1 above. In another example, the RF connection chip (122) and the bonding wire A (122c) may be omitted where the bonding wire B (122d) and bonding wire C (122e) are directly connected to the inner conductor (123a) and the outer conductor (123b), respectively. In this example, the RF bridge component (123) may be physically supported and secured in place using retaining details formed on the outer conductor (123b).

FIG. 2 shows a flowchart in accordance with one or more embodiments. The process depicted in FIG. 2 may be used to design, manufacture, and/or assemble an electronic device having a coaxial RF interface. The process shown in FIG. 2 may be performed based on the electronic assembly and electronic device discussed above in reference to FIGS. 1.1, 1.2, and 1.3. One or more steps shown in FIG. 2 may be omitted, repeated, and/or performed in a different order among different embodiments of the invention. Accordingly, embodiments of the invention should not be considered limited to the specific number and arrangement of steps shown in FIG. 2.

Initially, in Step 201, an electronic IC chip and an RF connection chip are mounted on a chip mounting substrate of an electronic device. In one or more embodiments of the invention, the electronic IC chip and RF connection chip are mounted on a chip side of the electronic IC chip using an alloy in a high temperature die-attach process and/or using an epoxy in a low temperature curing process. In one or more embodiments of the invention, the RF connection chip may be omitted.

In Step 202, an RF bridge component is installed for the electronic device. In one or more embodiments of the invention, the RF bridge component is positioned to penetrate an opening in the RF connection chip and another opening in the chip mounting substrate. Once properly positioned, the RF bridge component is connected to the electronic IC chip on the chip side of the chip mounting substrate and connected to a device mounted RF interface component on the opposing side of the chip mounting substrate.

In one or more embodiments, the RF bridge component is connected to the electronic IC chip via the RF connection chip. In particular, an inner conductor of the RF bridge component is connected to a signal connection of the electronic IC chip via a chip level signal trace of the RF connection chip. In addition, an outer conductor of the RF bridge component is connected to a ground connection of the electronic IC chip via a ground plane of the RF connection chip. In constructing the RF bridge component, the outer conductor encloses the inner conductor via an insulated layer to form a coax sleeve. In one or more embodiments, bonding wires are used for connecting the inner conductor of the RF bridge component to the signal connection of the electronic IC chip via the chip level signal trace of the RF connection chip. Similarly, bonding wires are also used for connecting the outer conductor of the RF bridge component to the ground connection of the electronic IC chip via the ground plane. In one or more embodiments, the RF bridge component, RF connection chip, and electronic IC chip are placed close to each other on the chip mounting substrate to control a length of the bonding wires for maintaining a signal quality.

In one or more embodiments, the RF bridge component is connected to a male coax connector of the device mounted RF interface component by soldering, or using other suitable method to attach the outer conductor to the hermetic enclosure base. In one or more embodiments, the inner connector of the RF bridge component includes contact fingers made of Be—Cu (beryllium-copper) to connect with the male coax connector.

In Step 203, the electronic device is enclosed in a hermetic enclosure that includes the device mounted RF interface component on a mounting side of the electronic device. For example, the device mounted RF interface component may be soldered, or attached using other method, onto the hermetic enclosure. In one or more embodiments of the invention, the chip mounting substrate is placed inside the hermetic enclosure such that the mounting side of the electronic device is opposite to the electronic IC chip across the chip mounting substrate. In other words, the mounting side of the electronic device and the electronic IC chip are on opposite sides of the chip mounting substrate. In one or more embodiments, a thermo-electric cooler is installed between the chip mounting substrate and the hermetic enclosure. In addition to penetrate the openings in the RF connection chip and the chip mounting substrate, the RF bridge component is positioned to further penetrate an opening in the thermo-electric cooler to connect to the device mounted RF interface component.

In Step 204, a substrate mounted RF interface component is installed on a device side of a device mounting substrate. In one or more embodiments, the substrate mounted RF interface component is installed using a soldering or SMT procedure. In particular, the substrate mounted RF interface component is connected to a device level signal trace of the device mounting substrate.

In Step 205, the electronic device is mounted on the device side of the device mounting substrate. In one or more embodiments of the invention, the electronic device is mounted by aligning the mounting side of the electronic device and the device side of the device mounting substrate. Accordingly, the device mounted RF interface component and the substrate mounted RF interface component are aligned and connected. In one or more embodiments, additional chips, such as an RF signal chip, etc., may be mounted onto the device mounting substrate in the same or another similar process of mounting the electronic device. In particular, the RF signal chip is connected to the device level signal trace such that the RF signal device and the electronic device may exchange an RF signal via the device level signal trace, the substrate mounted RF interface component, and the device mounted RF interface component.

FIGS. 3.1, 3.2, and 3.3 show an example in accordance with one or more embodiments of the invention. The example shown in FIGS. 3.1, 3.2, and 3.3 may be based on the schematic diagram and method flow chart discussed in reference to FIGS. 1.1, 1.2, 1.3, and FIG. 2 above. In particular, the components depicted in FIGS. 3.1, 3.2, and 3.3 are examples of the like-named components depicted in FIGS. 1.1, 1.2, 1.3 above. In one or more embodiments, one or more of the modules and elements shown in FIGS. 3.1, 3.2, and 3.3 may be omitted, repeated, and/or substituted. Accordingly, embodiments of the invention should not be considered limited to the specific arrangements of modules shown in FIGS. 3.1, 3.2, and 3.3.

FIG. 3.1 shows an example 3D view of an electronic assembly (300). For example, the schematic diagram depicted in FIG. 1.1 of the electronic assembly (100) may correspond to a cross sectional view of the electronic assembly (300). One or more components of the electronic assembly (100) may be obscured and not visible in the 3D view of an electronic assembly (300) due to the viewing angle of the 3D view.

As shown in FIG. 3.1, the electronic assembly (300) includes an electronic device (312) enclosed in a hermetic enclosure (302) for mounting on a host printed circuit board (PCB) (301). An example of the non-RF interface component (102b) depicted in FIG. 1.1 is shown as the soldering pins (302a) attached to the hermetic enclosure (302). In addition, an RF amplifier (304) and a female coax connector (303) are also mounted on the host PCB (301) and connected via a device level signal trace (305) of the host PCB (301). The device level signal trace (305) is shielded by a host PCB ground plane (301a) of the host PCB (301). For example, the RF amplifier (304) may use various packaging technologies, such as a quad-flat-no-leads (QFN) package, a ball grid array (BGA) package, etc. Accordingly, the soldering pins (302a), the RF amplifier (304), and the female coax connector (303) may be mounted onto the host PCB (301) using a soldering or SMT procedure. In particular, the host PCB (301), RF amplifier (304), and female coax connector (303) are examples of the device mounting substrate (101), RF signal device (104), and RF interface component B (103), respectively, depicted in FIG. 1.1 above. Although not shown in FIG. 1.1, a thermal interface (330) is inserted between the electronic device (312) and the host PCB (301) to improve heat dissipation of the electronic device (312).

As shown in FIG. 3.1 during installation of the electronic device (312) in the electronic assembly (300), the electronic device (312) is lowered onto the host PCB (301) and aligned with the female coax connector (303). Connecting a male coax connector (not shown) on the bottom of the hermetic enclosure (302) to the female coax connector (303) forms an RF link between the electronic device (312) and the RF amplifier (304). In an example scenario, the electronic device (312) is an InP based optical modulator used for a telecommunication equipment where the electronic assembly (300) is included. Positioning the coaxial interface underneath the hermetic enclosure (302) reduces the footprint of the electronic device (312) and improves the functionality of the telecommunication equipment.

FIG. 3.2 shows an example 3D view of the electronic device (312) depicted in FIG. 3.1. For example, the schematic diagrams depicted in FIGS. 1.2 and 1.3 of the electronic device (102) may correspond to a cross sectional view of the electronic device (312). One or more components of the electronic device (102) may be obscured and not visible in the 3D view of an electronic device (312) due to the viewing angle of the 3D view.

As shown in FIG. 3.2, the electronic device (312) includes a hermetic enclosure sidewall (302a) having the soldering pins (302a) as part of a non-RF interface component (313), a hermetic enclosure base (302b), an electronic IC chip (321) and RF connection chip (322) mounted on a chip mounting substrate (320), a thermo-electric cooler (324) inserted between the chip mounting substrate (320) and the hermetic enclosure base (302b), a male coax connector (325) beneath the hermetic enclosure base (302b), and a coax sleeve (323) with a ground coin (323a). In particular, the hermetic enclosure sidewall (302a) and hermetic enclosure base (302b) are part of the hermetic enclosure (302) depicted in FIG. 3.1 above. The coax sleeve (323) penetrates the RF connection chip (322), the chip mounting substrate (320), and the thermo-electric cooler (324) for connecting the electronic IC chip (321) and the male coax connector (325). Details of the coax sleeve (323) connecting the electronic IC chip (321) and the male coax connector (325) are described in reference to FIG. 3.3 below.

FIG. 3.3 shows example expanded 3D views of the electronic assembly (300) and electronic device (312) depicted in FIGS. 3.1 and 3.2. For example, the expanded 3D views depicted in FIG. 3.3 may correspond to a portion of the electronic assembly (300) and electronic device (312). One or more components of the electronic assembly (300) and electronic device (312) may be obscured and not visible in the expanded 3D views due to the limited scope of the expanded 3D views.

Specifically, the expanded 3D view A (330) shows the coax sleeve (323) penetrating the chip mounting substrate (320) and the thermo-electric cooler (324) and linked with the male coax connector (325) on the hermetic enclosure base (302b). In particular, the coax sleeve (323) includes an inner conductor (323c) that connects to or acts as a signal pin of the male coax connector (325). In addition, the coax sleeve (323) includes an outer conductor (323b) that connects to or contacts a conducting shroud of the male coax connector (325). With the coax sleeve (323) linked to the male coax connector (325), the male coax connector (325) is connected to the female coax connector (303) that is connected to the device level signal trace (305) shielded by the host PCB ground plane (301a). The coax sleeve (323), male coax connector (325), female coax connector (303), device level signal trace (305), and the host PCB ground plane (301a) form a 50-Ohm impedance transmission line for RF signal transmission.

Further, the expanded 3D view B (331) shows a portion (330a) of the expanded 3D view A (330) where the coax sleeve (323) connects to the electronic IC chip (321). As shown in the expanded 3D view B (331), the inner conductor (323c) of the coax sleeve (323) is connected to the chip level signal trace (322a) of the RF connection chip (322c). The chip level signal trace (322a) is connected to the signal connection (321a) of the electronic IC chip (321). These connections use the bonding wires (322c). In addition, the outer conductor (323b) of the coax sleeve (323) is soldered to, or otherwise in electrical contact with, the ground coin (323a) that is in turn soldered onto the ground plane (322b) of the RF connection chip (322c). In particular, the ground coin (323a) is a ring-shaped metal slice that facilitates electrical ground connection between the coax sleeve (323) and the RF connection chip (322). Further, the ground plane (322b) is connected to the ground connection (321b) of the electronic IC chip (321) using additional bonding wire(s).

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method, comprising:
　　disposing a first radio frequency (RF) coaxial connector on a device side of a device mounting substrate, wherein the device mounting substrate comprises a device level signal trace connecting an RF signal device and the first RF coaxial connector;
disposing a second RF coaxial connector on a mounting side of an electronic device; and
mounting the electronic device on the device side of the device mounting substrate, wherein the mounting comprises:
aligning the mounting side of the electronic device and the device side of the device mounting substrate; and
aligning and connecting the first RF coaxial connector and the second RF coaxial connector,
wherein the RF signal device and the electronic device are configured to exchange an RF signal via the device level signal trace, the first RF coaxial connector, and the second RF coaxial connector.

2. The method of claim 1, further comprising assembling the electronic device, the assembling comprising;
mounting an electronic integrated circuit (IC) chip on a chip side of a chip mounting substrate;
mounting the second RF coaxial connector on an opposing side of the chip mounting substrate, the opposing side opposing the chip side; and
installing an RF bridge component, wherein the installing comprises:
penetrating, by the RF bridge component, a first opening in the chip mounting substrate;
connecting the RF bridge component to the electronic IC chip on the chip side of the chip mounting substrate; and
connecting the RF bridge component to the second RF coaxial connector on the opposing side of the chip mounting substrate.

3. The method of claim 2, wherein the assembling the electronic device further comprises:
attaching a thermo-electric cooler to the chip mounting substrate on the opposing side;
enclosing, using a hermetic enclosure, the electronic IC chip, the chip mounting substrate, and the thermo-electric cooler, wherein the hermetic enclosure comprises the second RF coaxial connector; and
penetrating, by the RF bridge component, a third opening of the thermo-electric cooler, the third opening aligned with the first opening and the second opening.

4. The method of claim 2, wherein the assembling the electronic device further comprises:
connecting an inner conductor of the RF bridge component to a signal connection of the electronic IC chip via a chip level signal trace; and
connecting an outer conductor of the RF bridge component to a ground connection of the electronic IC chip via a ground plane,
wherein the outer conductor encloses the inner conductor via an insulated layer to form a coax sleeve,
wherein the first RF coaxial connector comprises a male coaxial connector, and
wherein the second RF coaxial connector comprises a female coaxial connector.

5. The method of claim 4, wherein the connecting the inner conductor to the signal connection via the chip level signal trace comprises:
connecting the inner conductor to the chip level signal trace using at least a first bonding wire;
connecting the signal connection to the chip level signal trace using at least a second bonding wire; and
controlling a length of the first bonding wire and the second bonding wire to maintain a signal quality.

6. An electronic device comprising:
an electronic integrated circuit (IC) chip;
a chip mounting substrate for mounting the electronic IC chip on a chip side of the chip mounting substrate;
a radio frequency (RF) coaxial connector disposed only on an opposing side of the chip mounting substrate, the opposing side opposing the chip side; and
an RF bridge component separate from the RF coaxial connector and penetrating a first opening in the chip mounting substrate and configured to operably connect the electronic IC chip and the RF coaxial connector.

7. The electronic device of claim 6, further comprising:
a thermo-electric cooler attached to the chip mounting substrate on the opposing side; and
a hermetic enclosure configured to enclose the electronic IC chip, the chip mounting substrate, and the thermo-electric cooler,
wherein the hermetic enclosure comprises the RF coaxial connector, and
wherein the RF bridge component is further configured to penetrate a third opening of the thermo-electric cooler, the third opening aligned with the first opening and the second opening.

8. The electronic device of claim 6, wherein the RF bridge component comprises:
an inner conductor connectable to a signal connection of the electronic IC chip; and
an outer conductor connectable to a ground connection of the electronic IC chip,
wherein the outer conductor encloses the inner conductor via an insulated layer to form a coax sleeve.

9. The electronic device of claim 8, further comprising:
a signal trace connecting the inner conductor to the signal connection; and
a ground plane connecting the outer conductor to the ground connection.

10. The electronic device of claim 9, further comprising:
an RF connection chip mounted to the chip mounting substrate on the chip side and adjacent to the electronic IC chip, the RF connection chip comprising the signal trace and the ground plane,
wherein the RF bridge component further penetrates a second opening in the RF connection chip, the second opening aligned with the first opening, and
wherein the RF bridge component is configured to operably connect the electronic IC chip and the RF coaxial connector via the RF connection chip.

11. The electronic device of claim 10, further comprising:
a first bonding wire connecting the inner conductor to the signal trace; and
a second bonding wire connecting the signal connection to the signal trace,
wherein the first bonding wire and the second bonding wire comprise a length that is controlled to maintain a signal quality.

12. The electronic device of claim 11,
wherein the RF connection chip comprises a thickness configured to reduce the length of the first bonding wire and the second bonding wire.

13. An electronic assembly, comprising:
a device mounting substrate for mounting an electronic device and a first radio frequency (RF) coaxial connector on a device side of the device mounting substrate, wherein the device mounting substrate comprises a device level signal trace connecting an RF signal device and the first RF coaxial connector;

the electronic device comprising a second RF coaxial connector disposed only on a mounting side of the electronic device,
  wherein the mounting side of the electronic device is aligned with the device side of the device mounting substrate, and
  wherein the first RF coaxial connector is aligned and connected with the second RF coaxial connector;
the RF signal device configured to exchange an RF signal with the electronic device via the device level signal trace, the first RF coaxial connector, and the second RF coaxial connector; and
the first RF coaxial connector.

14. The electronic assembly of claim 13, wherein the electronic device further comprises:
  an electronic integrated circuit (IC) chip;
  a chip mounting substrate for mounting the electronic IC chip on a chip side of the chip mounting substrate; and
  an RF bridge component penetrating a first opening in the chip mounting substrate, and configured to operably connect the electronic IC chip and the second RF coaxial connector, wherein the RF bridge component is separate from the first RF coaxial connector,
  wherein the second RF coaxial connector is disposed on an opposing side of the chip mounting substrate, the opposing side opposing the chip side.

15. The electronic assembly of claim 14, wherein the RF bridge component comprises:
  an inner conductor connectable to a signal connection of the electronic IC chip; and
  an outer conductor connectable to a ground connection of the electronic IC chip
  wherein the outer conductor encloses the inner conductor via an insulated layer to form a coax sleeve,
  wherein the first RF coaxial connector comprises a male coaxial connector, and
  wherein the second RF coaxial connector comprises a female coaxial connector.

16. The electronic assembly of claim 15, wherein the electronic device further comprises:
  a chip level signal trace connecting the inner conductor to the signal connection; and
  a ground plane connecting the outer conductor to the ground connection.

17. The electronic assembly of claim 16, wherein the electronic device further comprises:
  an RF connection chip mounted to the chip mounting substrate on the chip side and adjacent to the electronic IC chip, the RF connection chip comprising the chip level signal trace and the ground plane,
  wherein the RF bridge component further penetrates a second opening in the RF connection chip, the second opening aligned with the first opening, and
  wherein the RF bridge component is configured to operably connect the electronic IC chip and the second RF coaxial connector via the RF connection chip.

18. The electronic assembly of claim 17, wherein the electronic device further comprises:
  a first bonding wire connecting the inner conductor to the chip level signal trace; and
  a second bonding wire connecting the signal connection to the chip level signal trace,
  wherein the first bonding wire and the second bonding wire comprise a length that is controlled to maintain a signal quality.

19. The electronic assembly of claim 18,
  wherein the RF connection chip comprises a thickness configured to reduce the length of the first bonding wire and the second bonding wire.

20. The electronic assembly of claim 19, wherein the electronic device further comprises:
  thermo-electric cooler attached to the chip mounting substrate on the opposing side;
  a hermetic enclosure configured to enclose the electronic IC chip, the chip mounting substrate, and the thermo-electric cooler,
  wherein the hermetic enclosure comprises the second RF coaxial connector, and
  wherein the RF bridge component is further configured to penetrate a third opening of the thermo-electric cooler, the third opening aligned with the first opening and the second opening.

* * * * *